United States Patent
Takahama et al.

(10) Patent No.: US 9,006,564 B2
(45) Date of Patent: Apr. 14, 2015

(54) METHOD OF MANUFACTURING SOLAR CELL AND SOLAR CELL

(75) Inventors: Tsuyoshi Takahama, Neyagawa (JP); Masayoshi Ono, Sumoto (JO); Hiroyuki Mori, Kaizuka (JP); Youhei Murakami, Izumisano (JP)

(73) Assignee: Sanyo Electric Co., Ltd., Osaka (JP)

( * ) Notice: Subject to any disclaimer, the term of this patent is extended or adjusted under 35 U.S.C. 154(b) by 174 days.

(21) Appl. No.: 13/255,616

(22) PCT Filed: Mar. 10, 2010

(86) PCT No.: PCT/JP2010/053949
§ 371 (c)(1),
(2), (4) Date: Nov. 2, 2011

(87) PCT Pub. No.: WO2010/104098
PCT Pub. Date: Sep. 16, 2010

(65) Prior Publication Data
US 2012/0037227 A1    Feb. 16, 2012

(30) Foreign Application Priority Data
Mar. 10, 2009  (JP) ................................ 2009-057173

(51) Int. Cl.
| | | |
|---|---|---|
| *H01L 31/04* | (2014.01) | |
| *H01L 31/06* | (2012.01) | |
| *H01L 31/0224* | (2006.01) | |
| *H01L 31/068* | (2012.01) | |
| *H01L 31/0745* | (2012.01) | |
| *H01L 31/0747* | (2012.01) | |
| *H01L 31/18* | (2006.01) | |

(52) U.S. Cl.
CPC .... *H01L 31/022441* (2013.01); *H01L 31/0682* (2013.01); *H01L 31/022433* (2013.01); *H01L 31/0745* (2013.01); *H01L 31/0747* (2013.01); *H01L 31/1804* (2013.01); *Y02E 10/547* (2013.01)

(58) Field of Classification Search
USPC ......... 136/244, 252, 243, 258, 261, 249, 255; 438/717, 736, 98
See application file for complete search history.

(56) References Cited

U.S. PATENT DOCUMENTS

| | | |
|---|---|---|
| 7,096,873 B2 * | 8/2006 | Uemura et al. ................. 134/1.3 |
| 2005/0062041 A1 | 3/2005 | Terakawa et al. |
| 2008/0061293 A1 | 3/2008 | Ribeyron et al. |
| 2011/0000532 A1 | 1/2011 | Niira et al. |
| 2011/0132441 A1 | 6/2011 | Asaumi et al. |

FOREIGN PATENT DOCUMENTS

| | | |
|---|---|---|
| JP | 2005-101151 A | 4/2005 |
| JP | 2005-101240 A | 4/2005 |
| JP | 2005-101427 A | 4/2005 |
| JP | 2008-529265 A | 7/2008 |
| WO | 2009/096539 A1 | 8/2009 |
| WO | 2010/001848 A1 | 1/2010 |

* cited by examiner

*Primary Examiner* — Jeffrey T Barton
*Assistant Examiner* — Meisha Binkley
(74) *Attorney, Agent, or Firm* — Marvin A. Motsenbocker; Mots Law, PLLC

(57) ABSTRACT

A method for manufacturing a solar cell (100) includes the steps of removing a resist film (50) and removing a part of an n-type amorphous semiconductor layer (12*n*).

8 Claims, 10 Drawing Sheets

(a)

(b)

(a)

(b)

(a)

(b)

(a)

(b)

(a)

(b)

METHOD OF MANUFACTURING SOLAR CELL AND SOLAR CELL

TECHNICAL FIELD

The present invention relates to a method of manufacturing a back contact solar cell, and relates also to a solar cell.

BACKGROUND ART

Solar cells can convert sunlight, which is clean and is available in unlimited amounts, directly into electricity. Therefore, solar cells are expected as a new energy source.

Conventionally, a so-called back contact solar cell is proposed which includes a plurality of p-side electrodes and a plurality of n-side electrodes on the bottom surface of an n-type semiconductor substrate (see Patent Literature 1, for example).

Specifically, the solar cell according to Patent Literature 1 includes: an i-type semiconductor layer covering the bottom surface of an n-type semiconductor substrate; a plurality of p-type semiconductor layers formed along a predetermined direction on the i-type semiconductor layer; and an n-type semiconductor layer covering the i-type semiconductor layer and the plurality of p-type semiconductor layers. Each p-side electrode is formed above each p-type semiconductor layer, with the n-type semiconductor layer being interposed therebetween. Each n-side electrode is formed between the two p-side electrodes.

According to such a configuration, it is not necessary to cover the p-type semiconductor layer with a mask during a step of forming the n-type semiconductor layer, and thus, it is possible to simplify a step of manufacturing a solar cell.

CITATION LIST

Patent Literature

Patent Literature 1: Japanese Unexamined Patent Application Publication No. 2005-101151 (paragraph [0039], FIG. 2)

SUMMARY OF THE INVENTION

However, in the configuration according to Patent Literature 1, the n-side electrode and the p-side electrode are respectively formed on the n-type semiconductor layer. As a result, a leakage is easily generated between the n-side electrode and the p-side electrode, and this leads to a problem that a solar cell characteristic decreases.

The present invention has been achieved in view of the above-described problem, and an object thereof is to provide a method of manufacturing a back contact solar cell, capable of improving a solar cell characteristic, and to provide a solar cell.

A method of manufacturing a solar cell according to a feature of the present invention summarized as including the steps of: a step A of forming a first semiconductor layer having a first conductivity on a first region of one main surface of a semiconductor substrate; a step B of forming a second semiconductor layer having a second conductivity in a manner to extend over a second region of the one main surface and the first semiconductor layer; a step C of forming an electrode layer on the second semiconductor layer; a step D of applying a protection film on a region corresponding to the first region and the second region, of the electrode layer; a step E of removing a portion exposed from the protection film, of the electrode layer; and a step F of removing the protection film, wherein in the step F, at least one portion of a portion exposed from a mask, of the second semiconductor layer, is removed together with the protection film.

According to a method of manufacturing a solar cell based on a characteristic of the present invention, it is possible to decrease the thickness of a second semiconductor layer between electrode layers. Thus, it is possible to inhibit a leakage between electrode layers, without a need of patterning the second semiconductor layer with a mask, for example. As a result, it is possible to improve a solar cell characteristic.

A solar cell according to a feature of the present invention summarized as including: a semiconductor substrate; a first semiconductor layer having a first conductivity formed on a first region on one main surface of the semiconductor substrate; a second semiconductor layer having a second conductivity formed on a second region on the one main surface of the semiconductor substrate; a first electrode formed on the first semiconductor layer, on the first region; and a second electrode formed on the second semiconductor layer, on the second region, wherein the second semiconductor layer is formed in a manner to extend over the second region and the first semiconductor layer, and in a portion exposed from the first electrode and the second electrode, the second semiconductor layer includes a portion having a thickness smaller than a portion covered by the first electrode and the second electrode, of the second semiconductor layer.

In the solar cell according to the feature of the present invention, the conductivity of the second semiconductor layer may be p-type.

In the solar cell according to the feature of the present invention, the semiconductor substrate may be a crystalline silicon substrate.

In the solar cell according to the feature of the present invention, the semiconductor substrate may have an n-type conductivity.

In the solar cell according to the feature of the present invention, the first semiconductor layer and the second semiconductor layer may be formed of an amorphous semiconductor.

According to the present invention, it is possible to provide a method of manufacturing a back contact solar cell capable of improving a solar cell characteristic and a solar cell.

MODES FOR CARRYING OUT THE INVENTION

Figure 1:
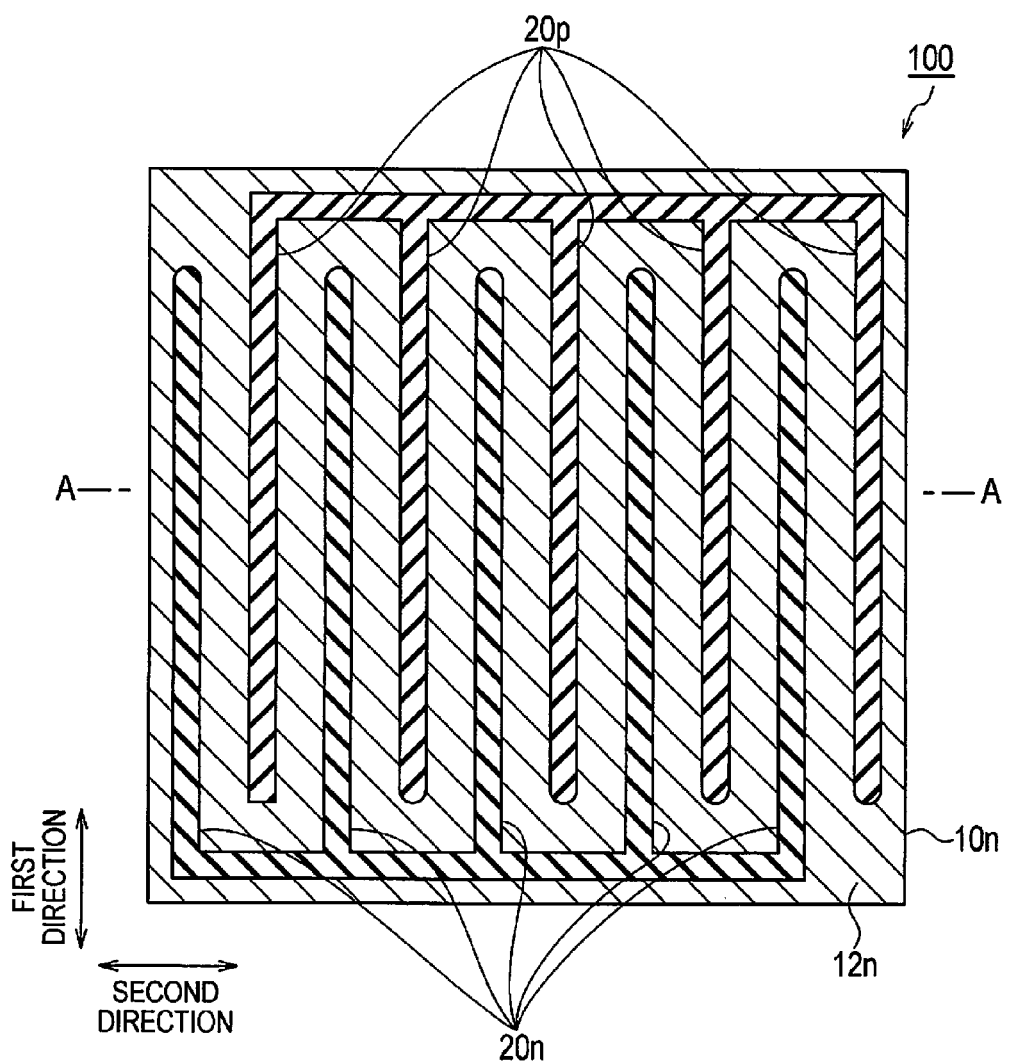
FIG. 1 is a plan view on the bottom surface side of a solar cell 100 according to a first embodiment of the present invention.

Next, with reference to the drawings, embodiments of the present invention will be described. In the following description of the drawings, the same or similar parts will be denoted by the same or similar reference numerals. However, it should be noted that the drawings are schematic and ratios of respective dimensions and the like are different from actual ones. Therefore, the specific dimensions, etc., should be determined in consideration of the following explanations. Moreover, as a matter of course, also among the drawings, there are included portions in which dimensional relationships and ratios are different from each other.

First Embodiment (Configuration of Solar Cell)

Figure 2:
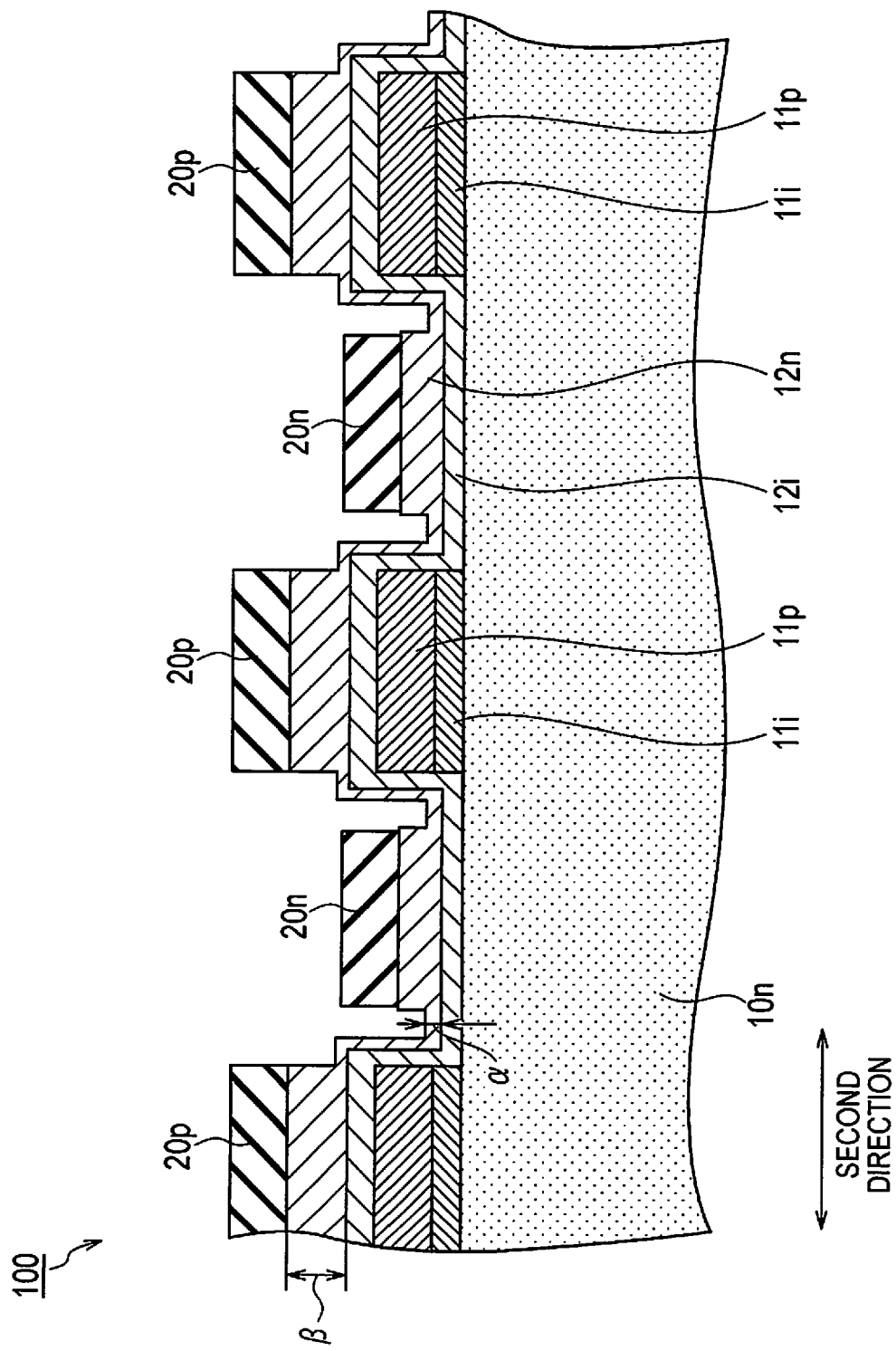
FIG. 2 is an enlarged cross-sectional view along the A-A line of FIG. 1.

The configuration of a solar cell according to the first embodiment of the present invention will be explained with reference to FIG. 1 and FIG. 2. FIG. 1 is a plan view on the bottom surface side of the solar cell 100 according to the first embodiment. FIG. 2 is an enlarged cross-sectional view along the A-A line of FIG. 1.

As illustrated in FIG. 1 and FIG. 2, the solar cell 100 includes an n-type crystalline silicon substrate 10n, an i-type amorphous semiconductor layer 11i, a p-type amorphous semiconductor layer 11p, an i-type amorphous semiconductor layer 12i, an n-type amorphous semiconductor layer 12n, a p-side electrode 20p, and an n-side electrode 20n.

The n-type crystalline silicon substrate 10n is formed of a laminated monocrystalline silicon or polycrystalline silicon. The n-type crystalline silicon substrate 10n includes a light receiving surface to receive solar light and a bottom surface arranged on an opposite side of the light receiving surface. The n-type crystalline silicon substrate 10n produces a carrier (electron and hole) by the light received on the light receiving surface. Although not illustrated, it should be noted that a structure (a metallic electrode, for example) that prevents light being incident thereon is not formed on the light receiving surface of the n-type crystalline silicon substrate 10n, and it is possible to receive light on the entire light receiving surface.

The i-type amorphous semiconductor layer 11i is formed along a first direction on the bottom surface of the n-type crystalline silicon substrate 10n. The i-type amorphous semiconductor layer 11i is formed without actively introducing an impurity. The thickness of the i-type amorphous semiconductor layer 11i is about several Å to 250 Å, for example, i.e., substantially not as sufficient as to contribute to the electric generation.

The p-type amorphous semiconductor layer 11p is formed along the first direction on the i-type amorphous semiconductor layer 11i. A plurality of p-type amorphous semiconductor layers 11p are formed by patterning, as described later. The p-type amorphous semiconductor layer 11p has p-type conductivity. The thickness of the p-type amorphous semiconductor layer 11p is about 10 nm, for example.

According to a structure in which the i-type amorphous semiconductor layer 11i and the p-type amorphous semiconductor layer 11p are sequentially formed on the n-type crystalline silicon substrate 10n (a so-called "HIT" (trademark, SANYO Electric Co., Ltd.) structure), it is possible to improve a pn junction characteristic.

The i-type amorphous semiconductor layer 12i is formed to extend over the bottom surface of the n-type crystalline silicon substrate 10n and the p-type amorphous semiconductor layer 11p. In the first embodiment, the i-type amorphous semiconductor layer 12i is formed to cover the entire bottom surface of the n-type crystalline silicon substrate 10n. The i-type amorphous semiconductor layer 12i is formed without actively introducing an impurity. The thickness of the i-type amorphous semiconductor layer 12i is about several Å to 250 Å, for example.

The n-type amorphous semiconductor layer 12n is formed on the i-type amorphous semiconductor layer 12i. In the first embodiment, the n-type amorphous semiconductor layer 12n is formed to cover the i-type amorphous semiconductor layer 12i. That is, the n-type amorphous semiconductor layer 12n is formed to extend over a plurality of patterned p-type amorphous semiconductor layers 11p. The n-type amorphous semiconductor layer 12n has n-type conductivity different from the p-type amorphous semiconductor layer 11p.

According to a structure in which the n-type amorphous semiconductor layer 12n is formed above the n-type crystalline silicon substrate 10n (a so-called "BSF structure"), it is possible to inhibit a recombination of minority carriers at the interface between the bottom surface of the n-type crystalline silicon substrate 10n and the amorphous semiconductor layer.

According to a structure in which the thin i-type amorphous semiconductor layer 12i is interposed between the bottom surface of the n-type crystalline silicon substrate 10n and the n-type amorphous semiconductor layer 12n, it is possible to improve a characteristic between the bottom surface of the n-type crystalline silicon substrate 10n and the n-type amorphous semiconductor layer 12n.

It is possible to configure each of the i-type amorphous semiconductor layer 11i, the i-type amorphous semiconductor layer 12i, the p-type amorphous semiconductor layer 11p, and the n-type amorphous semiconductor layer 12n by amorphous semiconductor containing silicon. Examples of the amorphous semiconductor include amorphous silicon, amorphous silicon carbide, and amorphous silicone germanium; however, the present invention is not limited thereto, and another amorphous semiconductor may be used. Each of the i-type amorphous semiconductor layer 11i, the i-type amorphous semiconductor layer 12i, the p-type amorphous semiconductor layer 11p, and the n-type amorphous semiconductor layer 12n may be configured by one element of the amorphous semiconductor, and may be configured by a combination of two or more elements of the amorphous semiconductor.

The p-side electrode 20p is a collecting electrode configured to collect a carrier. The p-side electrode 20p is configured of a metal layer such as Ag, Al, and a conductive paste. The p-side electrode 20p is formed above the p-type amorphous semiconductor layer 11p with the i-type amorphous semiconductor layer 12i and the n-type amorphous semiconductor layer 12n being interposed therebetween. Therefore, the p-side electrode 20p is formed in a line shape along the first direction. It is note that although not shown, a transparent electrode layer configured of tip-doped indium oxide (ITO), tin oxide, and zinc oxide, for example, may be inserted between the p-side electrode 20p and the n-type amorphous semiconductor layer 12n.

The n-side electrode 20n is a collecting electrode configured to collect a carrier. The n-side electrode 20n is configured of a metal layer such as Ag, Al, and a conductive paste. The n-side electrode 20n is formed above the bottom surface of the n-type crystalline silicon substrate 10n with the i-type amorphous semiconductor layer 12i and the n-type amorphous semiconductor layer 12n being interposed therebetween. Therefore, the n-side electrode 20n is formed in a line shape along the first direction, between one p-side electrode 20p and another p-side electrode 20p. It is noted that although not shown, the above-described transparent electrode layer may be inserted between the n-side electrode 20n and the n-type amorphous semiconductor layer 12n.

In this case, in this embodiment, as illustrated in FIG. 2, a thickness a of a portion exposed from the p-side electrode 20p and the n-side electrode 20n, of the n-type amorphous semiconductor layer 12n, is smaller than a thickness B of a portion covered by the p-side electrode 20p or the n-side electrode 20n, of the n-type amorphous semiconductor layer 12n. That is, the n-type amorphous semiconductor layer 12n is formed thinly between the p-side electrode 20p and the n-side electrode 20n. It is noted that in this embodiment, the thickness α is about several nm, and the thickness B is about several 10 nm; however, these thicknesses are not limited thereto.

(Method of Manufacturing Solar Cell)

Next, the method of manufacturing the solar cell 100 will be explained with reference to FIG. 3 to FIG. 7. Each figure (a) is a plan view in which the n-type crystalline silicon substrate 10n is viewed from the bottom surface side, and each figure (b) is a cross-sectional view of each figure (a).

Figure 3:
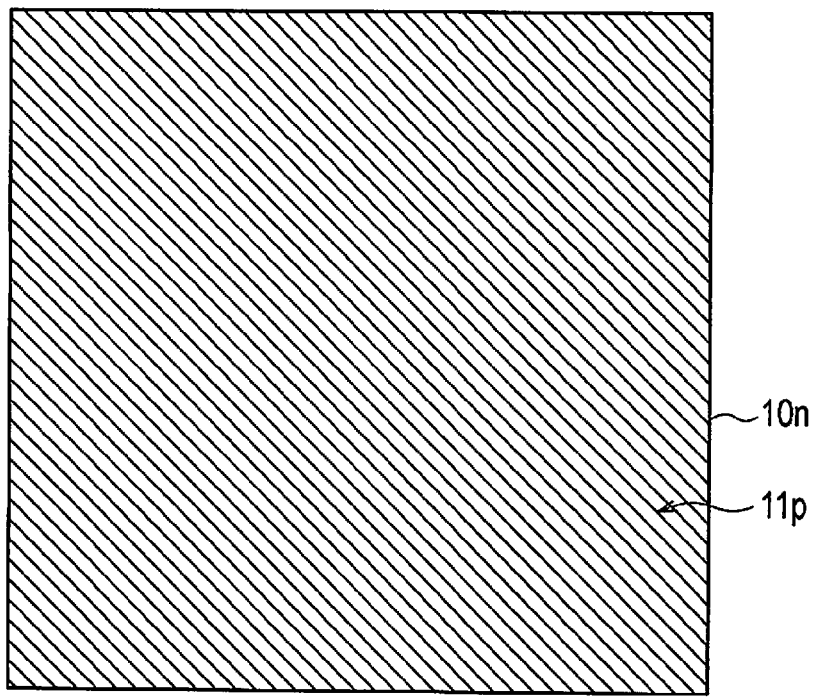
FIG. 3 is a diagram explaining a method of manufacturing a solar cell 10 according to a first embodiment of the present invention.
Figure 3:
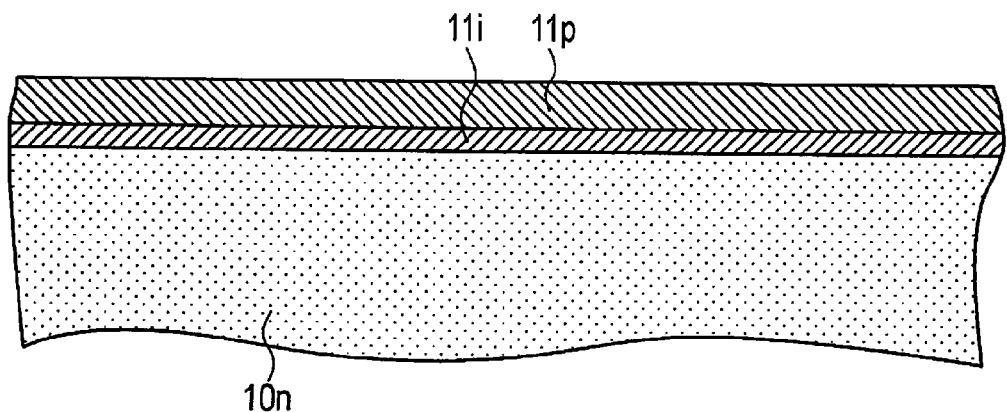

Firstly, as illustrated in FIG. 3, by using a CVD method, the i-type amorphous semiconductor layer 11i and the p-type amorphous semiconductor layer 11p are sequentially formed on the entire bottom surface of the n-type crystalline silicon substrate 10n.

Figure 4:
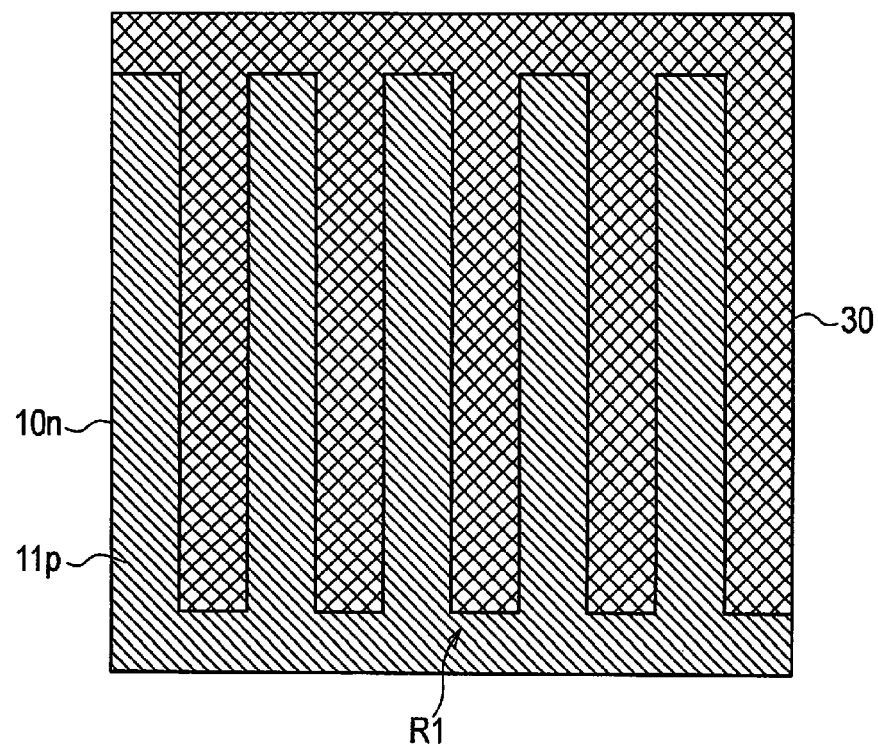
FIG. 4 is a diagram explaining a method of manufacturing a solar cell 10 according to the first embodiment of the present invention.
Figure 4:
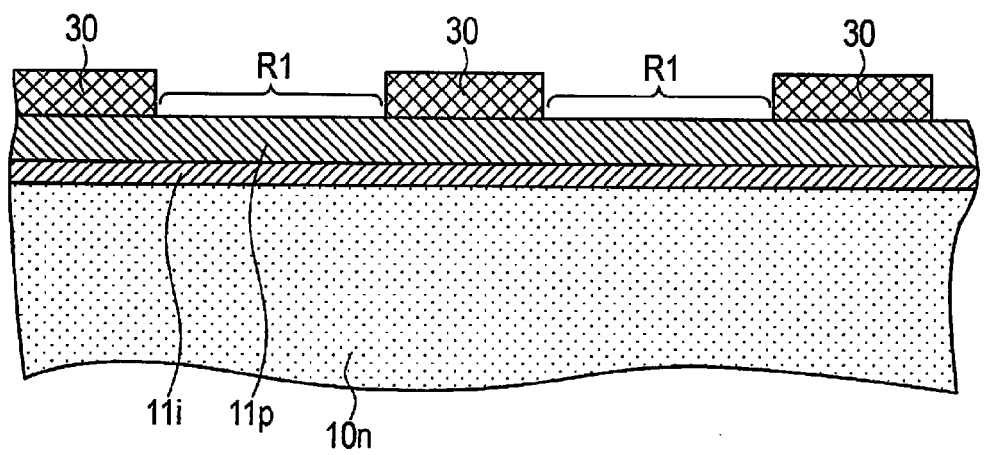

Subsequently, as illustrated in FIG. 4, on top of the p-type amorphous semiconductor layer 11p, a resist film 30 is coated in a predetermined pattern. The predetermined pattern is set corresponding to a region in which the p-side electrode 20p is formed. This is followed by performing a wet etching process to remove the region R1 that is exposed from the resist film 30 of the i-type amorphous semiconductor layer 11i and the p-type amorphous semiconductor layer 11p. As a result, the i-type amorphous semiconductor layer 11i and the p-type amorphous semiconductor layer 11p are patterned, and an approximately half the n-type crystalline silicon substrate 10n is exposed.

Then, after the removal of the resist film 30, a wet etching process and a hydrogen plasma process are performed to clean the region in which the n-type crystalline silicon substrate 10n is exposed.

Figure 5:
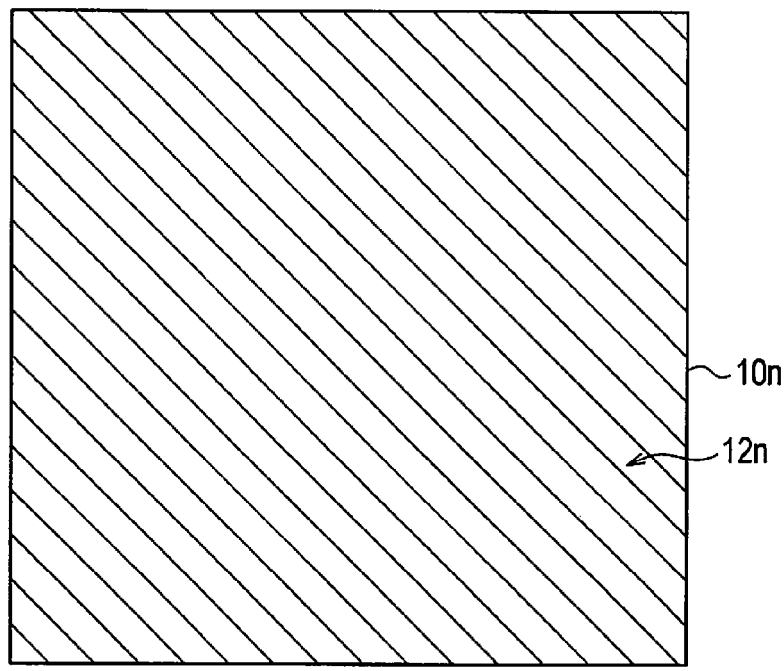
FIG. 5 is a diagram explaining a method of manufacturing a solar cell 10 according to the first embodiment of the present invention.
Figure 5:
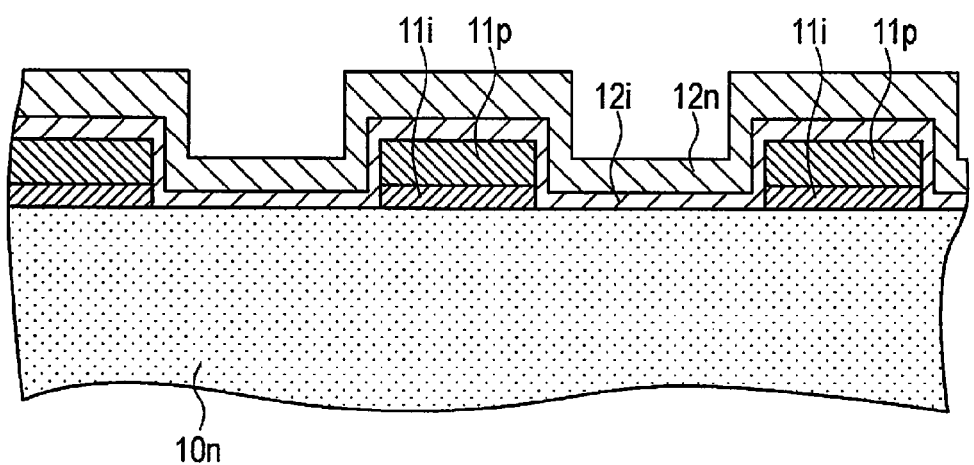

Subsequently, as illustrated in FIG. 5, a CVD method is used to sequentially form the i-type amorphous semiconductor layer 12i and the n-type amorphous semiconductor layer 12n in a manner to extend over the bottom surface of the n-type crystalline silicon substrate 10n and the p-type amorphous semiconductor layer 11p.

Figure 6:
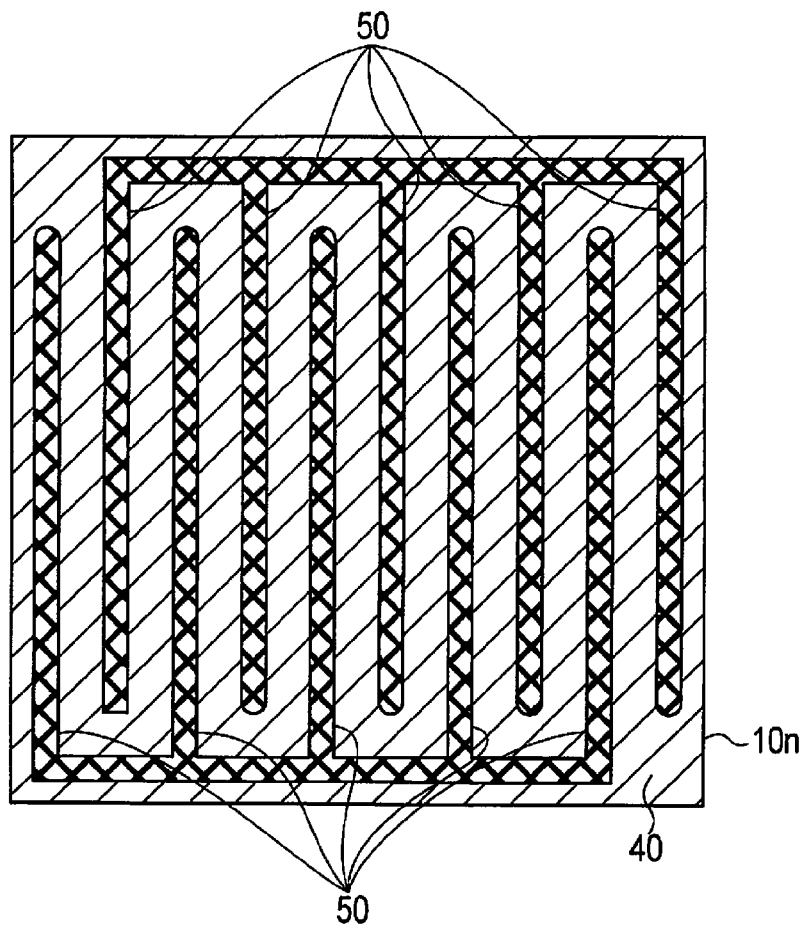
FIG. 6 is a diagram explaining a method of manufacturing a solar cell 10 according to the first embodiment of the present invention.
Figure 6:
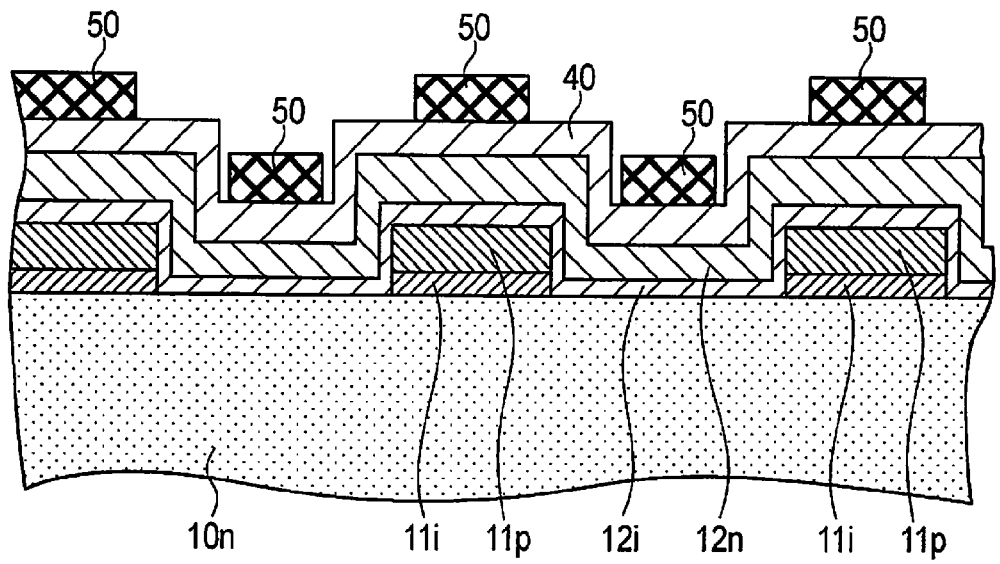

Next, a CVD method, a sputtering method, a vapor deposition method, plating method, a print method, etc., are used to form an electrode layer 40 on the n-type amorphous semiconductor layer 12n. This is followed by coating a photoresist film (protection film) on the electrode layer 40 and patterning the photoresist film by exposing it in a predetermined pattern. As a result, as illustrated in FIG. 6, a patterned resist film 50 (protection film) is applied above a region in which the p-type amorphous semiconductor layer 11p is formed and other regions, of the surface of the electrode layer 40.

Figure 7:
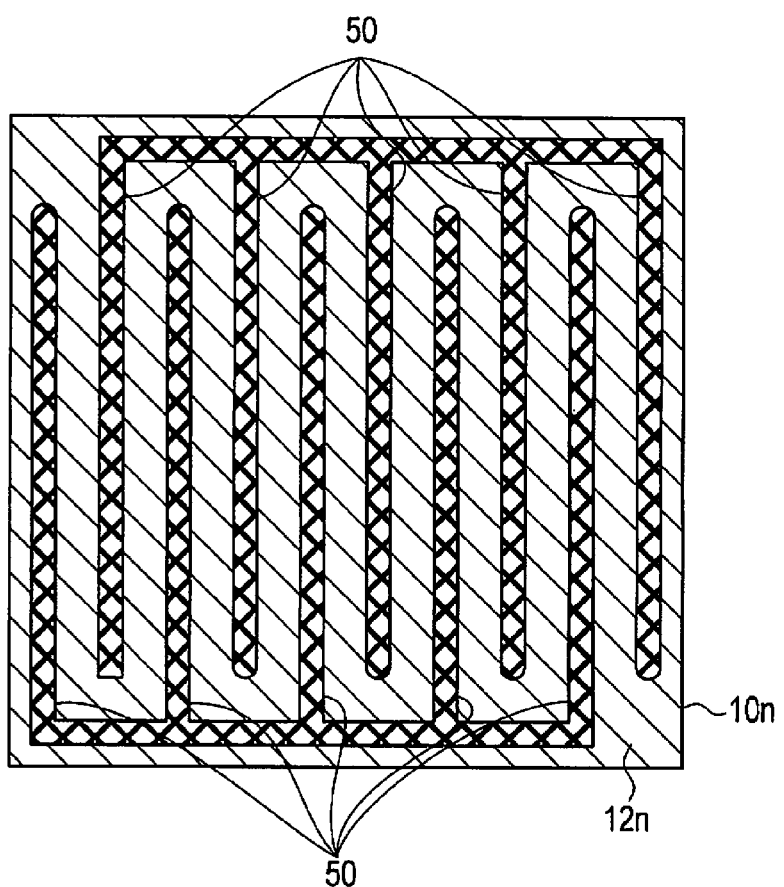
FIG. 7 is a diagram explaining a method of manufacturing a solar cell 10 according to the first embodiment of the present invention.
Figure 7:
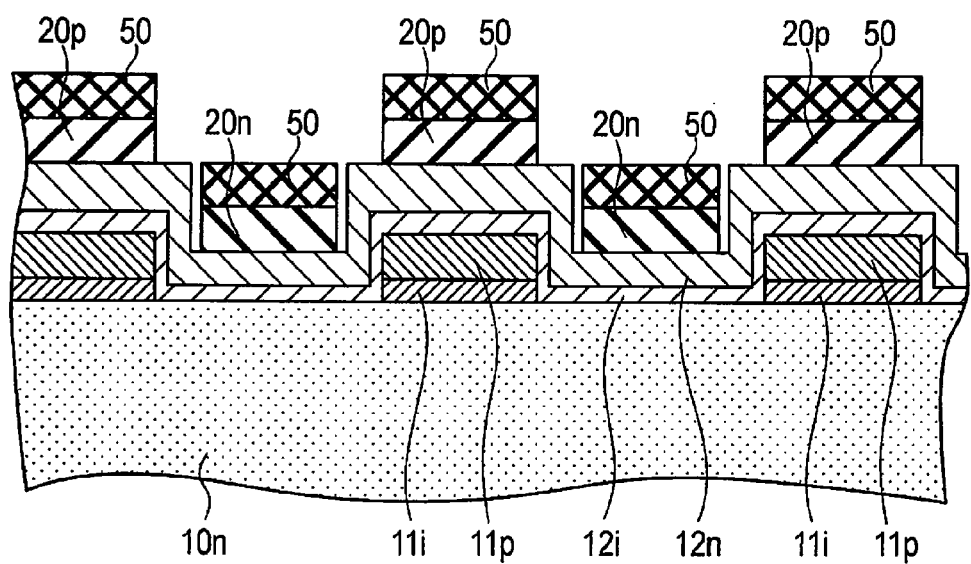

Then, as illustrated in FIG. 7, a portion exposed from the resist film 50, of the electrode layer 40, is removed by using a sodium hydroxide solution, for example. As a result, the p-side electrode 20p and the n-side electrode 20n are formed, and at the same time, one portion of the n-type amorphous semiconductor layer 12n is exposed.

Subsequently, a wet etching process is performed to remove the resist film 50 and one portion of the n-type amorphous semiconductor layer 12n. As a result, the thickness of a portion exposed from the resist film 50, of the n-type amorphous semiconductor layer 12n, decreases.

(Operation and Effect)

A method of manufacturing the solar cell 100 according to the first embodiment includes a step of removing the resist film 50 and one portion of the n-type amorphous semiconductor layer 12n.

Therefore, the thickness α of a portion exposed from the p-side electrode 20p and the n-side electrode 20n, of the n-type amorphous semiconductor layer 12n, is smaller than the thickness β of a portion covered by the p-side electrode 20p or the n-side electrode 20n, of the n-type amorphous semiconductor layer 12n. That is, the n-type amorphous semiconductor 12n includes a portion having the thickness α smaller than the thickness β of the portion covered by the p-side electrode 20p and the n-side electrode 20n of the n-type amorphous semiconductor 12n, in the portion exposed from the p-side electrode 20p and the n-side electrode 20n. This can increase a resistance of the n-type amorphous semiconductor layer 12n between the p-side electrode 20p and the n-side electrode 20n. Thus, it is possible to inhibit a leakage between the p-side electrode 20p and the n-side electrode 20n without a need of patterning the n-type amorphous semiconductor layer 12n by using a mask, for example. As a result, it is possible to improve a characteristic of the solar cell 100.

Second Embodiment

Hereinafter, the solar cell 100 according to a second embodiment will be explained with reference to drawings. The explanation below is based primarily on the differences with respect to the first embodiment.

Figure 8:
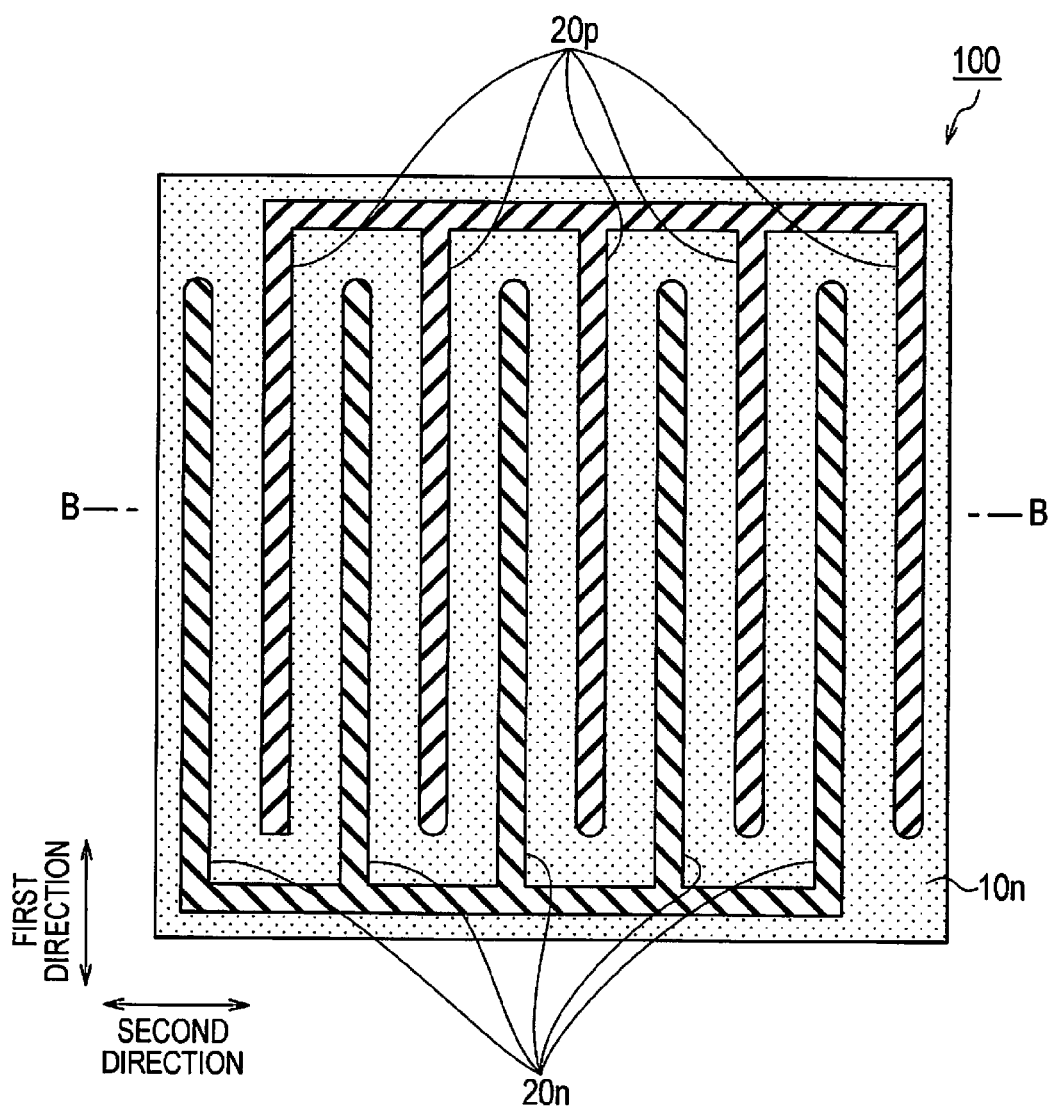
FIG. 8 is a plan view on the bottom surface side of a solar cell 100 according to a second embodiment of the present invention.
Figure 9:
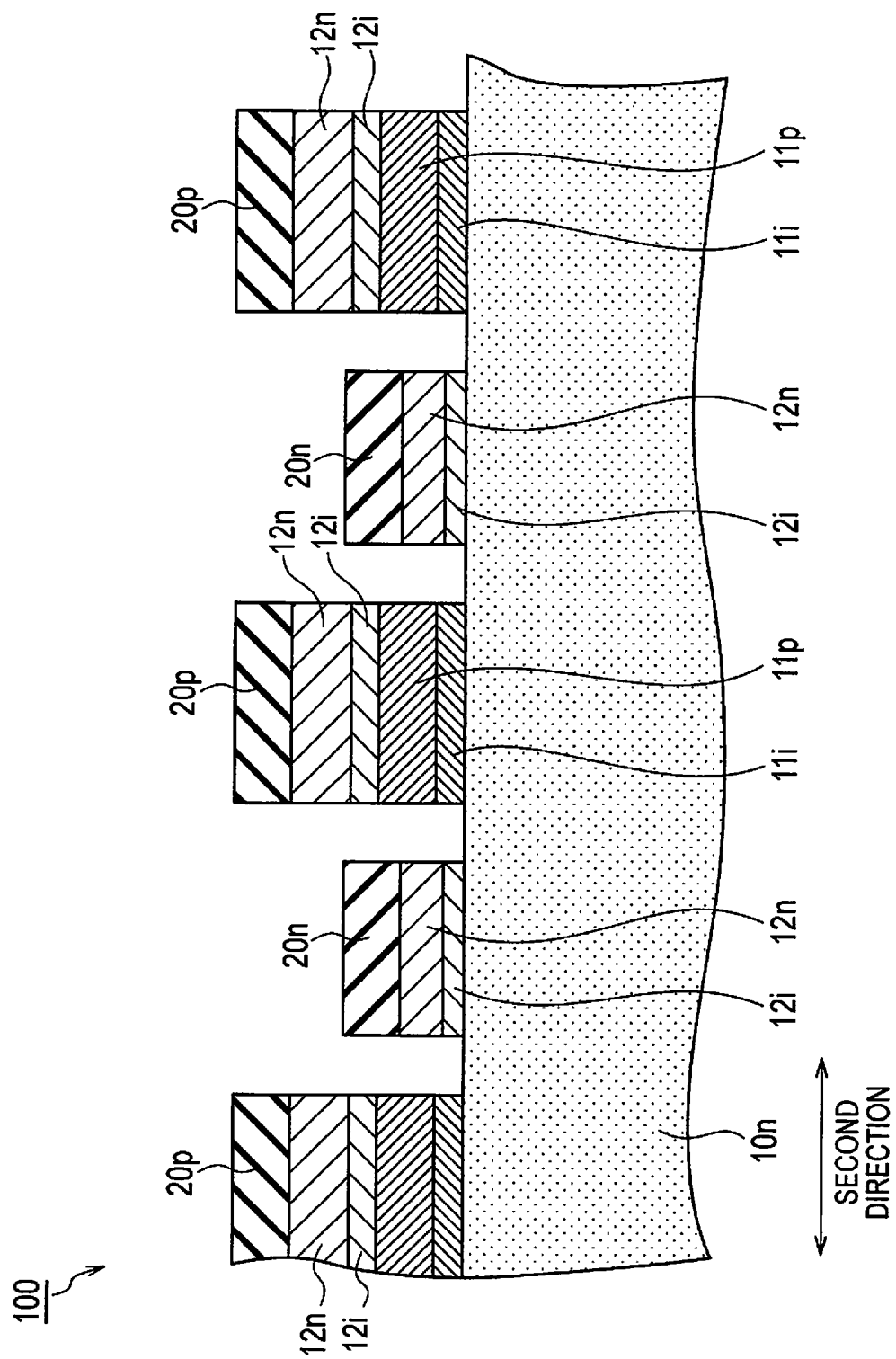
FIG. 9 is an enlarged cross-sectional view along the B-B line of FIG. 8.

The configuration of a solar cell according to the second embodiment of the present invention will be explained with reference to drawings. FIG. 8 is a plan view in which the solar cell 100 is viewed from the bottom surface side. FIG. 9 is an enlarged cross-sectional view along the B-B line of FIG. 8.

As illustrated in FIG. 8 and FIG. 9, the i-type amorphous semiconductor layer 12i and the n-type amorphous semiconductor layer 12n are removed between the p-side electrode 20p and the n-side electrode 20n. Between the p-side electrode 20p and the n-side electrode 20n, the bottom surface of the n-type crystalline silicon substrate 10n is exposed.

Specifically, when removing the above-described resist film 50, etching solution having a high etching rate for the amorphous semiconductor layer is used. As a result, in addition to the removal of the resist film 50, not only the n-type amorphous semiconductor layer 12n but also the i-type amorphous semiconductor layer 12i can be removed.

(Operation and Effect)

A method of manufacturing the solar cell 100 according to the second embodiment includes a step of removing the resist film 50 and also removing the i-type amorphous semiconductor layer 12i and the n-type amorphous semiconductor layer 12n.

Thus, it is possible to inhibit a leakage between the p-side electrode 20p and the n-side electrode 20n without a need of patterning the i-type amorphous semiconductor layer 12i and the n-type amorphous semiconductor layer 12n by using a mask, for example. As a result, it is possible to further improve a characteristic of the solar cell 100.

Other Embodiments

Although the present invention has been described with reference to the above embodiments, it should be understood that the present invention is not limited to the description and drawings which constitute a part of this disclosure. From this disclosure, various alternative embodiments, examples and operational technologies will become apparent to those skilled in the art.

For example, in the above embodiments, the n-type crystalline silicon substrate 10n is used as a substrate of the solar cell 100; however, the present invention is not limited thereto. For example, the substrate of the solar cell 100 may be imparted with a p-type conductivity. Moreover, the substrate of the solar cell 100 may be configured of a general semiconductor material including a crystalline semiconductor material such as polycrystalline Si and microcrystalline Si, or a compound semiconductor material such as GaAs and InP.

Although there is no particular description in the above-described embodiments, when a p-type substrate is used, the p-type amorphous semiconductor layer 11p and the n-type amorphous semiconductor layer 12n are formed in an opposite manner to the formation of the above embodiments. That is, the p-type amorphous semiconductor layer 11p is formed to extend over a plurality of patterned n-type amorphous semiconductor layers 12p. In this case, generally, the p-type amorphous semiconductor tends to have a larger electric resistance than the n-type amorphous semiconductor, and thus, it is possible to further inhibit the generation of a leakage between the p-side electrode 20p and the n-side electrode 20n.

Figure 10:
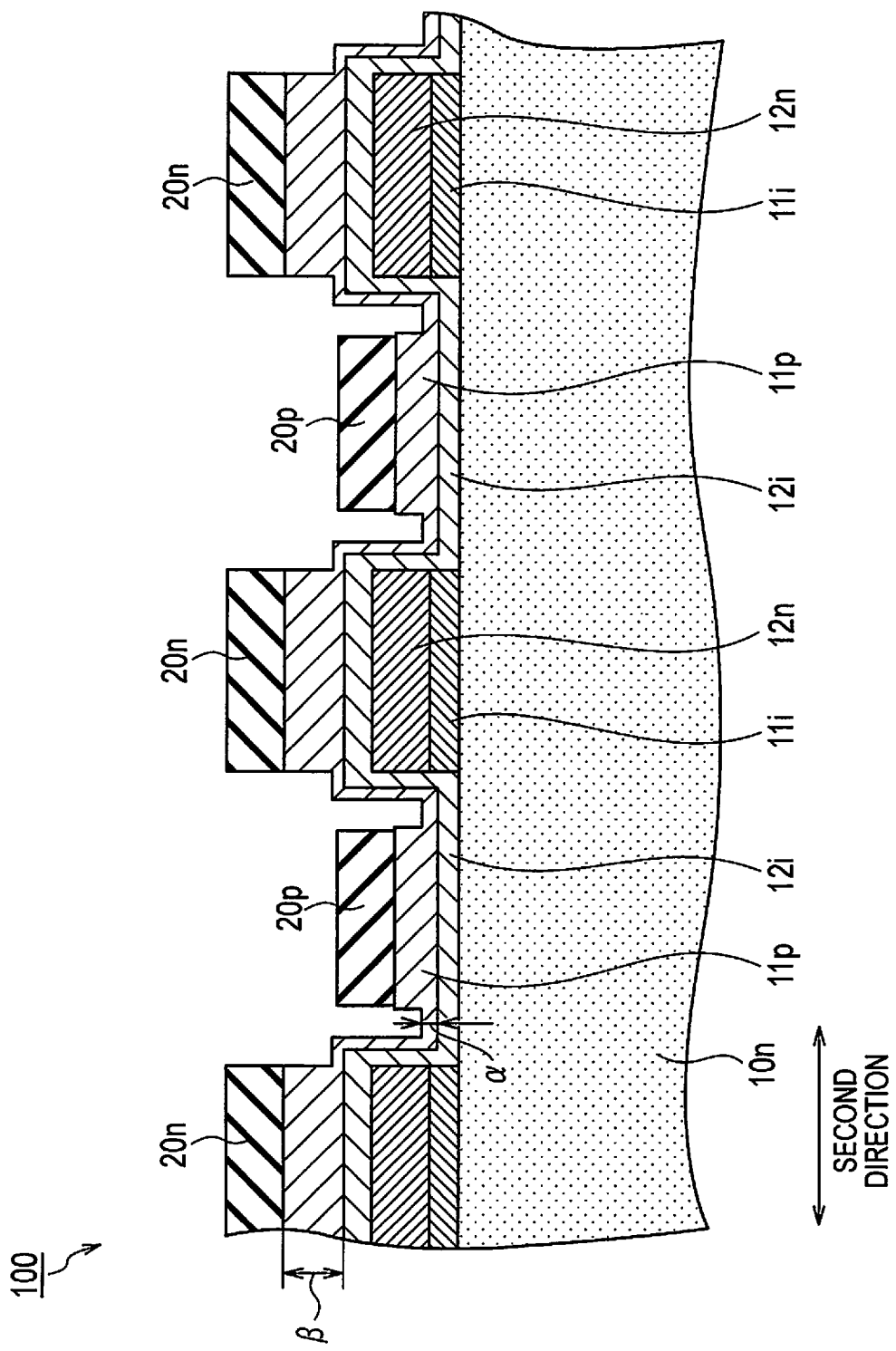
FIG. 10 is a cross-sectional view illustrating the configuration of the solar cell 100 according to an embodiment of the present invention.

In the first embodiment, the n-type amorphous semiconductor layer 12n is formed to extend over a plurality of patterned p-type amorphous semiconductor layers 11p; however, the conductivity of the amorphous semiconductor layer may be opposite. Specifically, as illustrated in FIG. 10, the p-type amorphous semiconductor layer 11p may be formed to extend over a plurality of patterned n-type amorphous semiconductor layers 12n on the bottom surface of the n-type crystalline silicon substrate 10n. In this case, generally, p-type amorphous silicon tends to have a larger electric resistance than n-type amorphous silicon, and thus, it is possible to further inhibit the generation of a leakage between the p-side electrode 20p and the n-side electrode 20n.

In the above-described embodiments, the i-type amorphous semiconductor layer 11i and the i-type amorphous semiconductor layer 12i are formed without actively introducing the impurities; however, only a very small amount of dopant may be included.

Although there is no particular description in the above-described embodiments, the i-type amorphous semiconductor layer 13i may not be formed on the bottom surface of the n-type crystalline silicon substrate 10n. In this case, it is possible to further reduce the resistance on the bottom surface side of the n-type crystalline silicon substrate 10n.

In the second embodiment, the i-type amorphous semiconductor layer 12i, together with the n-type amorphous semiconductor layer 12n, is removed; however, at least one portion of the i-type amorphous semiconductor layer 12i may be left on the substrate. Even when the n-type amorphous semiconductor layer 12n only is removed, it is possible to improve a leakage prevention effect.

It is noted that the entire contents of Japanese Patent Application No. 2009-57173 (filed on Mar. 10, 2009) are hereby incorporated in the present specification by reference.

INDUSTRIAL APPLICABILITY

Thus, in the method of manufacturing a solar cell and the solar cell according to the present invention, it is possible to provide a method of manufacturing a back contact solar cell capable of improving a solar cell characteristic and a solar cell, and thus, these are effective in the solar cell manufacture field.

EXPLANATION OF REFERENCE NUMERALS

10 SOLAR CELL
10n n-TYPE CRYSTALLINE SILICON SUBSTRATE
11i i-TYPE AMORPHOUS SEMICONDUCTOR LAYER
11p p-TYPE AMORPHOUS SEMICONDUCTOR LAYER
12i i-TYPE AMORPHOUS SEMICONDUCTOR LAYER
12n n-TYPE AMORPHOUS SEMICONDUCTOR LAYER
20n n-SIDE ELECTRODE
20p p-SIDE ELECTRODE
30,50 RESIST FILM
40 ELECTRODE LAYER
100 SOLAR CELL

The invention claimed is:

1. A solar cell, comprising:
a semiconductor substrate;
a first semiconductor layer having a first conductivity formed on a first region on one main surface of the semiconductor substrate;
a second semiconductor layer having a second conductivity positioned on a second region on the one main surface of the semiconductor substrate;
a first electrode formed on the first semiconductor layer, on the first region; and
a second electrode formed on the second semiconductor layer, on the second region, wherein
the second semiconductor layer continuously extends under both the first and second electrodes from the second region and covers the first semiconductor layer, wherein
a portion of the second semiconductor layer that is exposed from the first electrode and the second electrode includes a portion having a thickness in a direction orthogonal to the one main surface that is smaller than a portion of the second semiconductor layer that is covered by the first electrode and the second electrode.

2. The solar cell according to claim 1, wherein the conductivity of the second semiconductor layer is p-type.

3. The solar cell according to claim 1, wherein the semiconductor substrate is a crystalline silicon substrate.

4. The solar cell according to claim 1, wherein the semiconductor substrate has an n-type conductivity.

5. The solar cell according to claim 3, wherein the first semiconductor layer and the second semiconductor layer are formed of an amorphous semiconductor.

6. The solar cell according to claim 2, wherein the semiconductor substrate is a crystalline silicon substrate.

7. The solar cell according to claim 2, wherein the semiconductor substrate has an n-type conductivity.

8. The solar cell of claim 1, wherein the second semiconductor layer is formed continuously on top of the first semiconductor layer.

* * * * *